(12) United States Patent
Kawahata

(10) Patent No.: US 6,356,318 B1
(45) Date of Patent: Mar. 12, 2002

(54) ACTIVE-MATRIX LIQUID CRYSTAL DISPLAY HAVING STORAGE CAPACITORS OF AREA SMALLER THAN THAT OF PIXEL ELECTRODES

(75) Inventor: Ken Kawahata, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/603,047

(22) Filed: Jun. 26, 2000

(30) Foreign Application Priority Data

Jun. 28, 1999 (JP) .......................................... 11-181949

(51) Int. Cl.$^7$ ...................... G09F 1/1393; G02F 1/1333
(52) U.S. Cl. ............................ 349/38; 349/43; 349/138
(58) Field of Search ............................ 349/38, 158, 43

(56) References Cited

U.S. PATENT DOCUMENTS

| | | | |
|---|---|---|---|
| 5,132,819 A | 7/1992 | Noriyama et al. ............. 349/43 |
| 5,162,933 A | * 11/1992 | Kakuda et al. ................ 349/38 |
| 5,724,107 A | * 3/1998 | Nishikawa et al. ............ 349/38 |
| 5,745,195 A | * 4/1998 | Zhang ......................... 349/39 |
| 6,184,945 B1 | * 2/2001 | Sung .......................... 349/38 |

* cited by examiner

Primary Examiner—Toan Ton
(74) Attorney, Agent, or Firm—Brinks Hofer Gilson & Lione

(57) ABSTRACT

An active-matrix liquid crystal display has storage capacitors each having a small area relative to the area of each of pixel electrodes and has a large aperture ratio. A plurality of gate lines are formed on a lower substrate and a plurality of source lines are formed on the lower substrate so as to extend perpendicularly to the gate lines. Thin-film transistors are formed near the intersections of the gate lines and the source lines. Pixel electrodes are connected to the thin-film transistors and storage capacitors. Each storage capacitor includes an upper electrode, a lower electrode disposed opposite to the upper electrode, and an insulating film sandwiched between the upper and the lower electrode. The insulating film for the storage capacitors and gate insulating film for the thin-film transistors are formed separately. The insulating film for the storage capacitors is formed of a material different from that of the gate insulating film in a thickness smaller than that of the gate insulating film so that the storage capacitors have a large capacitance per unit area.

22 Claims, 4 Drawing Sheets

FIG. 7 PRIOT ART
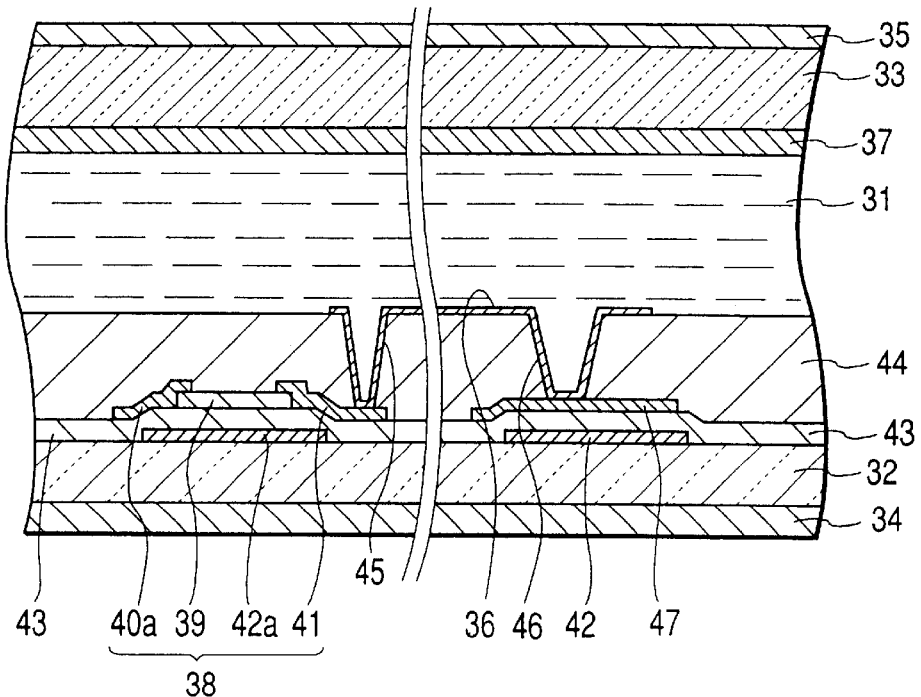
FIG. 8 PRIOR ART
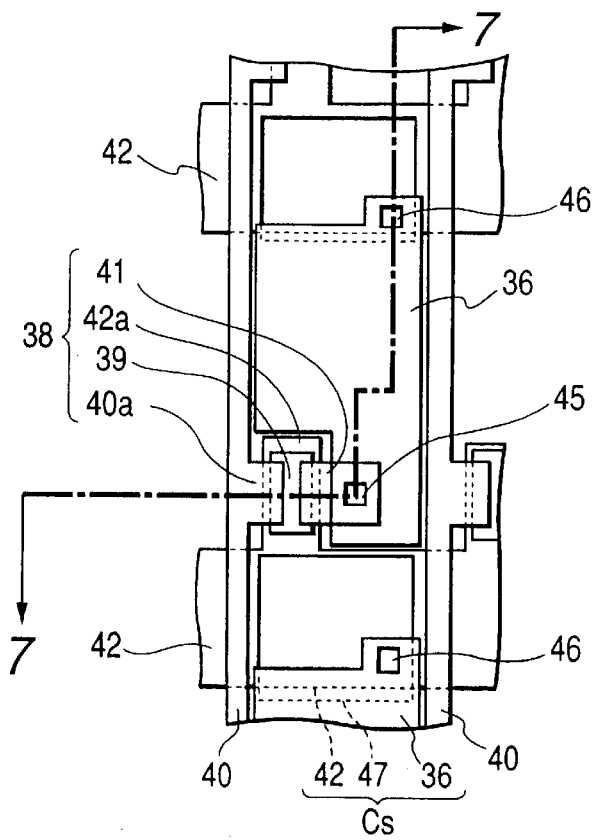

ACTIVE-MATRIX LIQUID CRYSTAL DISPLAY HAVING STORAGE CAPACITORS OF AREA SMALLER THAN THAT OF PIXEL ELECTRODES

BACKGROUND OF THE INVENTION

1. Field of the Invention

The present invention relates to an active-matrix liquid crystal display having a display screen provided with a plurality of pixel electrodes, thin-film transistors (hereinafter referred to as "TFTs") as switching elements respectively corresponding to the pixel electrodes, and storage capacitors respectively corresponding to the pixel electrodes.

2. Description of the Related Art

The configuration of a conventional active-matrix liquid crystal display will be described with reference to FIGS. 7 and 8. FIG. 8 is a plan view of an essential part of an array substrate underlying a liquid crystal included in the active-matrix liquid crystal display, and FIG. 7 is a sectional view taken on line 7—7 in FIG. 8 and showing the essential part of the array substrate, a liquid crystal layer and an arrangement overlying the liquid crystal layer. As shown in FIG. 7, a liquid crystal layer 31 is filled and sealed in a space between a transparent lower substrate 32 and a transparent upper substrate 33 disposed opposite to the lower substrate 32. Polarizing plates 34 and 35 are attached to the respective outer surfaces of the lower substrate 32 and the upper substrate 33, respectively. Transparent pixel electrodes 36 are formed on the inner surface of the lower substrate 32, and common electrodes 37 are formed on the inner surface of the upper substrate 33 opposite to the pixel electrodes 36.

Referring to FIG. 8, formed on the lower substrate 32 are a plurality of parallel gatelines 42, i.e., scanning lines, and a plurality of parallel source lines 40, i.e., signal lines, extending perpendicularly to the gate lines 42.

The transparent pixel electrodes 36 are formed in rectangular regions surrounded by the gate lines 42 and the source lines 40, respectively. A TFT 38, i.e., a switching element, formed near the intersection of each source line 40 and each gate line 42. The TFT 38 turns on to apply a data signal voltage to the corresponding pixel electrode 36 and turns off to shut the data signal voltage to the same pixel electrode 36. Thin-film storage capacitors Cs for holding charges on the pixel electrodes 36 are formed on the gate lines 42.

Each of the TFTs 38 includes a source electrode 40a extending from the source line 40, a drain electrode 41, a gate electrode 42a extending from the gate line 42 and a gate insulating film 43. The drain electrode 41 is connected through a contact hole 45 formed in a layer insulating film 44 to the pixel electrode 36. The pixel electrode 36 is connected through a contact hole 46 to the upper electrode 47 of the storage capacitor Cs. The gate line 42 formed on the lower substrate 32 serves as the lower electrode of the storage capacitor Cs. The upper electrode 47 is disposed opposite to the gate line 42 with the gate insulating film 43 interposed therebetween.

In this conventional active-matrix liquid crystal display, a data signal voltage is applied to a selected one of the plurality of source lines 40 and a control signal is applied to a selected one of the plurality of gate lines 42 to drive the TFT 38 connected to the selected source line 40 and the selected gate line 42, whereby the data signal voltage is applied to the pixel electrode 36 connected to the drain electrode 41 of the TFT 38. The TFTs 38 respectively connected to the pixel electrodes 36 arranged in a matrix are thus driven to display a desired pattern on the screen.

As shown in FIG. 7, the gate insulating film 43 of the TFT 38 serves also as an insulating film for the storage capacitor Cs. Use of a single film formed by a single process as both the gate insulating film 43 and the insulating film for the storage capacitor Cs is favorable in view of simplifying a liquid crystal display fabricating process. The thickness of the film is determined so that the gate insulating film 43 of the TFT 38 has a sufficient dielectric strength.

Although dependent on the configuration of the storage capacitor Cs, a voltage to be applied to the storage capacitor Cs is in the range of ¼ to ½ of a voltage to be applied to the TFT 38. Therefore, a thickness of the insulating film for the storage capacitor Cs having a sufficient dielectric strength may be smaller than that of the gate insulating film 43 of the TFT 38. Thus, the thickness of the gate insulating film 43 of the TFT 38 is excessively great for the insulating film for the storage capacitor Cs.

The area of the storage capacitor Cs is calculated by dividing a predetermined charge storage capacity necessary for driving the pixel electrode 36 by the storage capacity per unit area of the thin-film storage capacitor Cs. Since the storage capacity per unit area is uniquely dependent on the dielectric constant and the thickness of the gate insulating film 43, the area of the storage capacitor Cs is determined on the basis of the dielectric constant and the thickness of the gate insulting film 43.

An active-matrix liquid crystal display must have a high optical transmittance, i.e., a large aperture ratio, to display pictures in a high picture quality. When the size of pixels is reduced for high-definition displaying, an area occupied by the storage capacitors Cs increases relatively and hence the aperture ratio is reduced. If the brightness of back light is increased to compensate the reduction of the aperture ratio, the power consumption of the active-matrix liquid crystal display increases.

The area of the storage capacitors Cs needs to be reduced to increase the aperture ratio. However, since the insulating film for the storage capacitors Cs is part of the gate insulating film 43 of the TFTs 38 and the thickness of the gate insulating film 43 is determined on the basis of the dielectric strength of the TFTs 38, the capacitance per unit area of the storage capacitor Cs cannot be individually increased. Consequently, the area of the storage capacitor Cs cannot be reduced securing the predetermined capacitance of the storage capacitor Cs and the aperture ratio decreases inevitably when the size of the pixels is reduced for high-definition displaying.

SUMMARY OF THE INVENTION

Accordingly, it is an object of the present invention to provide an active-matrix liquid crystal display having a large aperture ratio achieved by forming storage capacitors each having a small area relative to that of pixel electrodes.

According to a first aspect of the present invention, an active-matrix liquid crystal display comprises: a transparent upper substrate; a transparent lower substrate disposed opposite to the upper substrate; a liquid crystal filled and sealed in a space between the upper and the lower substrate; a plurality of parallel gate lines formed on the lower substrate; a plurality of parallel source lines formed on the lower substrate so as to extend perpendicularly to the gate lines; TFTs formed at intersections of the gate lines and the source lines, respectively; pixel electrodes connected to the TFTs, respectively; and storage capacitors connected to the pixel electrodes, respectively; wherein separate films are used as an insulating film included in the storage capacitors and a gate insulating film included in the TFTs, respectively, and each of the storage capacitors has an upper electrode connected to the pixel electrode and a lower electrode disposed opposite to the upper electrode with the insulating film sandwiched between the upper and the lower electrode. The capacitance per unit area of the storage capacitors can be determined independently of the thickness of the gate insulating film for the TFTs. Therefore, the area of each storage capacitor can be reduced relative to the area of each pixel electrode by increasing the capacitance per unit area of the storage capacitors.

Preferably, the upper electrodes are formed only in flat regions on the insulating film overlying the lower electrodes. When the upper electrodes are thus, formed, dielectric breakdown at steps in the insulating film around the lower electrode does not occur easily. Therefore, the thickness of the insulating film can be reduced so as to meet the required dielectric strength of the storage capacitors, which enables the further increase of the capacitance per unit area of the storage capacitors.

Preferably, the insulating film for the storage capacitors and the gate insulating film for the TFTs are formed of the same material, and the thickness of the insulating film for the storage capacitors is smaller than that of the gate insulating film for the TFTs. A gate insulating film forming process can be applied to forming the insulating film. Thus, the capacitance per unit area of the storage capacitors can be increased and the area of each storage capacitor can be reduced relative to the area of each pixel electrode without complicating an active-matrix liquid crystal display fabricating process.

The insulating film for the storage capacitors may be formed of a material having a dielectric constant greater than that of a material forming the gate insulating film. Thus, the capacitance per unit of the storage capacitors can be increased and the area of each storage capacitor can be reduced relative to that of the pixel electrode.

BRIEF DESCRIPTION OF THE DRAWINGS

The above and other objects, features and advantages of the present invention will become more apparent from the following description taken in connection with the accompanying drawings, in which:

FIG. 7 is a fragmentary sectional view of a conventional active-matrix liquid crystal display; and FIG. 8 is a plan view of an essential part of an array substrate included in the active-matrix liquid crystal display shown in FIG. 7.

DESCRIPTION OF THE PREFERRED EMBODIMENTS

Figure 1:
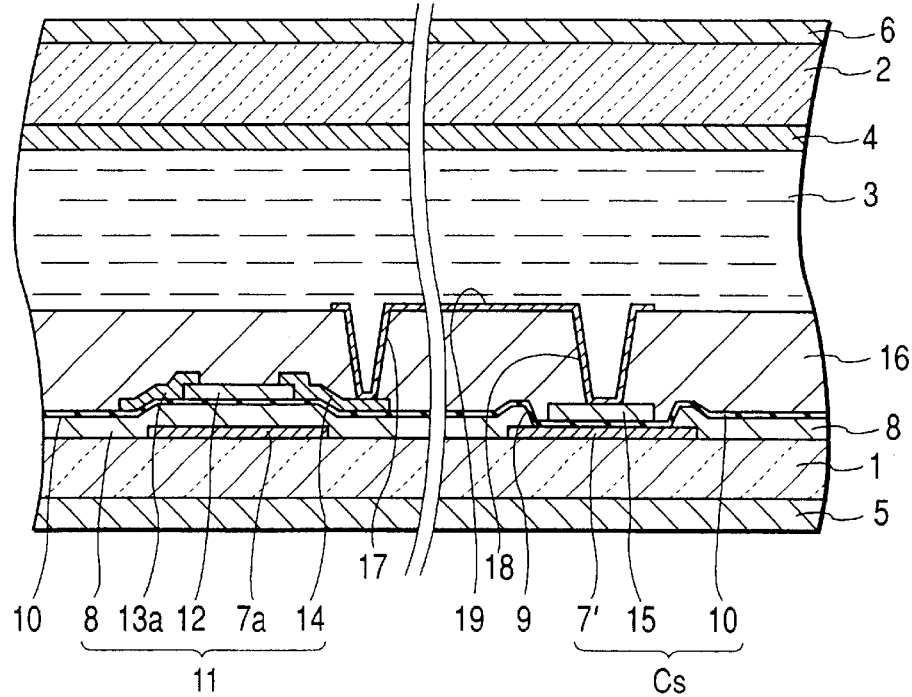
FIG. 1 is a fragmentary sectional view of an active-matrix liquid crystal display in a first embodiment according to the present invention.
Figure 2:
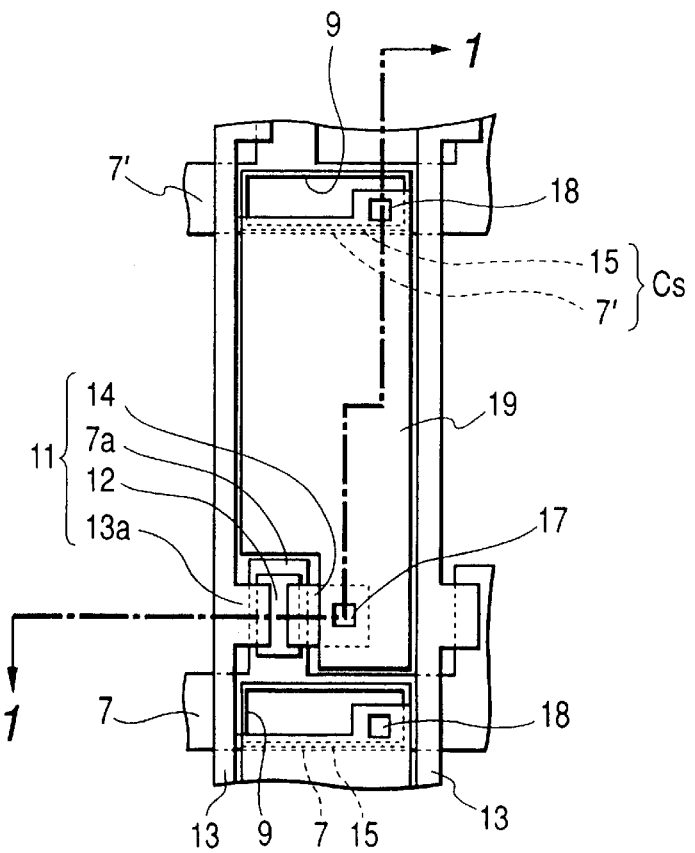
FIG. 2 is a plan view of an essential part of an array substrate included in the active-matrix liquid crystal display shown in FIG. 1.

An active-matrix liquid crystal display in a first embodiment according to the present invention will be described with reference to FIGS. 1 and 2. FIG. 2 is a plan view of an essential part of an array substrate included in the active-matrix liquid crystal display and FIG. 1 is a sectional view taken on line 1—1 in FIG. 2, showing the array substrate combined with a liquid crystal layer and upper components. Referring to FIGS. 1 and 2, the active-matrix liquid crystal display has a transparent lower substrate 1 of glass, a transparent upper substrate 2 of glass disposed opposite to the lower substrate 1 so as to define a space between the substrates 1 and 2, and a liquid crystal layer 3 filled and sealed in the space between the substrates 1 and 2. Gate lines 7 and 7' and gate electrodes 7a are formed on the lower substrate 1. A gate insulating film 8 of a thickness in the range of 3000 to 5000 Å is formed so as to cover the gate lines 7 and 7' and the gate electrodes 7a.

The gate insulating film 8 is formed of silicon nitride ($SiN_x$) or the like. Openings 9 are formed in part of the gate insulating film 8 overlying the gate lines 7' in regions corresponding to storage capacitors Cs to form the storage capacitors Cs therein. An insulating film 10 for forming the storage capacitors Cs is formed on the gate insulating film 8. In the following description, an insulating film for the storage capacitors Cs will be referred to simply as "insulating film", and other insulating films will be referred to as "gate insulating film" and "interlayer insulating film" signifying the functions of the insulating films. The insulating film 10 is formed of a material having a large dielectric constant, for example, $SiN_x$, tantalum oxide (TaOx) such as $Ta_2O_5$. The insulating film 10 has a thickness smaller than that of the gate insulating film 8. In the first embodiment, both the gate insulating film 8 and the insulating film 10 are formed of $SiN_x$. The insulating film 10 is formed in a thickness great enough to secure a dielectric strength necessary for the storage capacitors Cs. The thickness of the insulating film 10 is in the range of 500 to 1500 Å.

TFTs 11 are formed on the insulating film 10 in regions above the gate electrodes 7a. Each TFT 11 has a source electrode 13a extending from the source line 13, and a drain electrode 14. The source electrode 13a and the drain electrode 14 are formed on the opposite side parts of channel forming region of a semiconductor layer 12 of amorphous silicon (a-Si) The superposed gate insulating film 8 and the insulating film 10 serves as the gate insulating film for the TFT 11. Each storage capacitor Cs has a lower electrode and an upper electrode 15. The gate line 7' serves as the lower electrode of each storage capacitor Cs. The insulating film 10 is sandwiched between the gate line 7', i.e., the lower electrode, and the upper electrode 15. The upper electrode 15 is formed only in a flat region of the insulating film 10 and hence dielectric breakdown at steps in the insulating film 10 does not occur easily. Therefore, the insulating film 10 may be thin and hence the storage capacitor Cs has a large capacitance per unit area.

The source lines 13, the source electrodes 13a, the drain electrodes 14 and the upper electrodes 15 may be formed of the same metal, such as chromium (Cr), molybdenum (Mo), aluminum (Al) or the like in a thickness in the range of 1000 to 3000 Å. Although the gate lines 7' are used as the lower electrodes of the storage capacitors Cs in the first embodiment, special wiring lines maybe used instead of the gate lines 7' for forming the lower electrodes.

The interlayer insulating film 16 is formed of a polymer, such as a photosensitive polyimide, in a thickness in the range of 1 to 3 μm. Contact holes 17, 18 respectively reaching the drain electrodes 14 and the upper electrodes 15 are formed in the interlayer insulating film 16. A film of indium tin oxide (ITO) or the like of a thickness in the range of 500 to 1500 Å is formed on the interlayer insulating film 16 and is processed to form pixel electrodes 19. The pixel electrodes 19 are connected through the contact holes 17 and 18 to the drain electrodes 14 and the upper electrodes 15, respectively. A common electrode 4 of ITO or the like is formed on a surface of the upper substrate 2 facing the lower substrate 1. Polarizing plates 5 and 6 are attached to the outer surfaces of the substrates 1 and 2, respectively.

As shown in FIG. 2, the TFTs 11 are formed near the intersections of the source lines 13 and the gate lines 7 and 7' extended perpendicularly to the source lines 13. Each storage capacitor Cs is formed by laminating the upper electrode 15 connected to the pixel electrode 19, the insulating film 10, and the gate line 7' connected to the TFT for another pixel electrode in that order. The gate line 7' serves as the lower electrode of the storage capacitor Cs.

The transparent lower substrate 1 provided with the storage capacitors Cs is formed by the following process. A metal film of Cr, Mo, Al or the like for forming the plurality of gate lines 7 and 7' and the gate electrodes 7a extending from the gate lines 7 and 7' is formed on the transparent lower substrate 1, and the metal film is etched for patterning. The gate insulating film 8 for the TFTs 11 is formed. Parts of the gate insulating film 8 over the parts of the gate lines 7' serving as the lower electrodes of the storage capacitors Cs are removed by etching to form the openings 9 for the storage capacitors Cs. Generally, the gate insulating film 8 is formed by a CVD process when SiNx is used for forming the gate insulating film 8.

Then, the insulating film 10 is formed. The insulating film 10 is formed on the gate insulating film 8 in regions corresponding to the TFTs 11 and serves as part of a film for forming gates. Then, the semiconductor layer 12 for forming the channels of the TFTs 11 is formed. A metal film for forming the source lines 13, the source electrodes 13a extending from the source lines 13, the drain electrodes 14 and the upper electrodes 15 of the storage capacitors Cs is formed by a sputtering process. The semiconductor layer 12 is patterned to complete the TFTs 11 and the storage capacitors Cs. The upper electrodes 15 are formed only in flat regions of the insulating film 10.

Subsequently, the interlayer insulating film 16 of a photosensitive organic material is formed by a spin coating process, and the contact holes 17 and 18 are formed in the interlayer insulating film 16 by a photolithographic process. A transparent conductive film for forming the pixel electrodes 19 is formed by a sputtering process, and the transparent conductive film is patterned by etching to form the pixel electrodes 19. The pixel electrodes 19 are connected through the contact holes 17 to the drain electrodes 14, respectively, and through the contact holes 18 to the upper electrodes 15 of the storage capacitors Cs, respectively.

The transparent lower substrate 1 thus fabricated and the transparent upper substrate 2 provided with the common electrode 4 are combined so as to form a space between the substrates 1 and 2, a liquid crystal is filled and sealed in the space between the substrates 1 and 2, and the polarizing plates 5 and 6 are attached to the outer surfaces of the substrates land 2, respectively, to complete the active-matrix liquid crystal display in the first embodiment.

The thickness of the insulating film 10 for the storage capacitors Cs of the first embodiment is about ⅓ or below of that of the corresponding film of the conventional active-matrix liquid crystal display and the storage capacitors Cs have a large capacitance per unit area. Accordingly, the area of each storage capacitor Cs is smaller than that of the pixel electrode 19. Consequently, the active-matrix liquid crystal display in the first embodiment has an aperture ratio of 55%, whereas the conventional active-matrix liquid crystal display has an aperture ratio of about 40% at the greatest.

Figure 3:
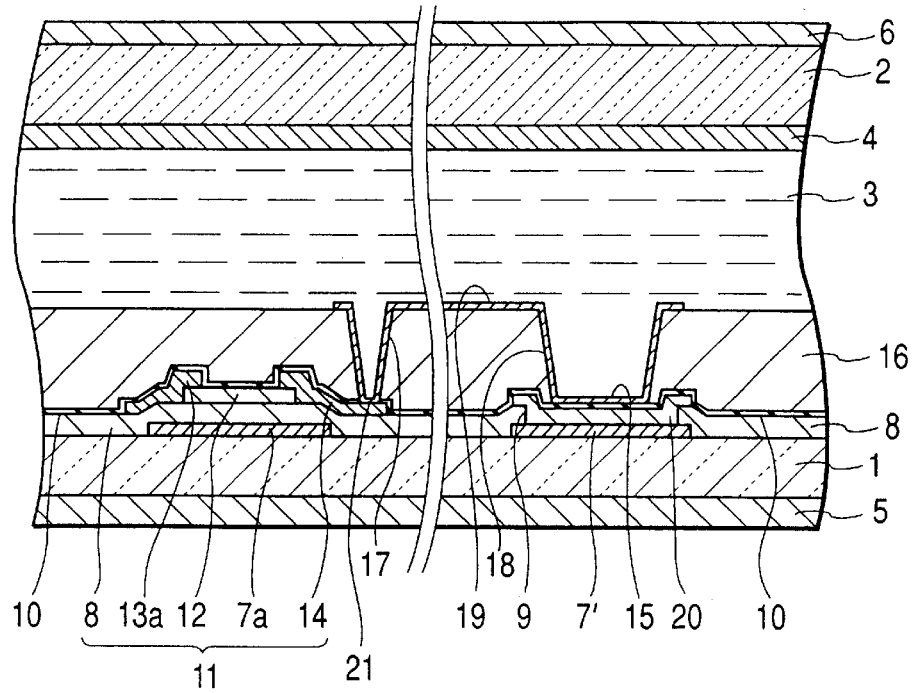
FIG. 3 is a fragmentary sectional view of an active-matrix liquid crystal display in a second embodiment according to the present invention.
Figure 4:
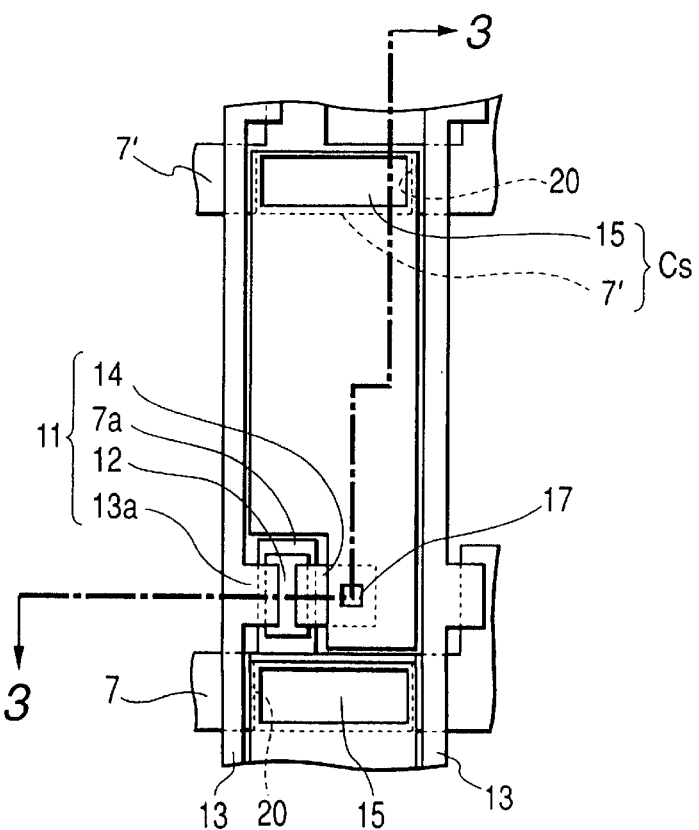
FIG. 4 is a plan view of an essential part of an array substrate included in the active-matrix liquid crystal display shown in FIG. 3.

An active-matrix liquid crystal display in a second embodiment according to the present invention will be described with reference to FIGS. 3 and 4, in which parts like or corresponding to those shown in FIGS. 1 and 2 are denoted by the same reference characters and the description thereof will be omitted. FIG. 4 is a plan view of an essential part of an array substrate included in the active-matrix liquid crystal display and FIG. 3 is a sectional view taken on line 3—3 in FIG. 4, showing the array substrate combined with a liquid crystal layer and upper components. Part of a process for fabricating the active-matrix liquid crystal display in the second embodiment from the first step to steps of forming the gate insulating film 8 for the TFTs 11 and removing parts of the gate insulating film 8 overlying the gate lines 7' is the same as that of the process for fabricating the active-matrix liquid crystal display in the first embodiment. After forming the semiconductor layer 12 for forming the channels of the TFTs 11, a metal film for forming the source lines 13, the source electrodes 13a extending from the source lines 13, the drain electrodes 14 and an auxiliary electrodes 20 forming part of the lower electrodes of the storage capacitors Cs is formed. The metal film is patterned by etching. Parts of the insulating film 8 overlying the gate lines 7' are removed to form the openings 9 for the storage capacitors Cs so as to expose parts of the gate lines 7', and the auxiliary electrodes 20 are formed on the exposed parts of the gate lines 7'. The auxiliary electrodes 20 forms the lower electrodes of the storage capacitors Cs together with the gate lines 7'.

The insulating film 10 for the storage capacitors Cs is formed over the entire surface of the lower substrate 1 including regions in which the TFTs 11 are formed. Parts of the insulating film 10 corresponding to contact holes 21 to be connected to the drain electrodes 14 are removed by etching. Then, the interlayer insulating film 16 is formed over the entire surface of the lower substrate 1, and parts of the interlayer insulating film 16 corresponding to the contact holes 17 to be connected to the drain electrodes 14 and parts of the same corresponding to regions where the storage capacitors Cs are to be formed, i.e., parts corresponding to flat parts of the insulating film 10 overlying the auxiliary electrodes 20, are removed by a photolithographic process. In this step, the interlayer insulating film 16 may be formed immediately after forming the insulating film 10, and the contact holes 17 in the interlayer insulating film 16 and the contact holes 21 in the insulating film 10 may be formed successively by etching.

In the second embodiment, the upper electrodes 15 of the storage capacitors Cs is formed of the transparent conductive film forming the pixel electrodes 19. Therefore, parts of the interlayer insulating film 16 must be removed so that the pixel electrodes 19 are formed over the entire regions of the storage capacitors Cs and the upper electrodes 15 are formed in flat parts of the insulating film 10. After thus removing parts of the interlayer insulating film 16, a transparent conductive film is formed, and the pixel electrodes 19 and the upper electrodes 15 of the storage capacitors Cs are formed simultaneously by patterning.

Basically, the effect of the second embodiment is the same as that of the first embodiment. The second embodiment differs from the first embodiment in not using the insulating film 10 for the storage capacitors Cs as the gate insulating film that affects the operation of the TFTs 11. Therefore, the material forming the insulating film 10 for the storage capacitors Cs can be optionally determined without affecting the performance of the TFTs 11. For example, $TaO_x$ or the like having a dielectric constant greater than that of $SiN_x$, can be relatively easily used to increase the capacitance per unit area of the storage capacitors Cs. Since the auxiliary electrodes 20 overlie considerably large parts of the gate lines 7 and 7', the total wiring resistance of the gate lines 7 and 7' is reduced by the secondary effect of the second embodiment.

In the second embodiment, the insulating film 10 for the storage capacitors Cs may be formed of $SiN_x$ as well as the gate insulating film 8. Preferably, the thickness of the insulting film 10 is equal to that of the insulating film 10 of the first embodiment. The other films of the second embodiment may be the same in material and thickness as the corresponding films of the first embodiment.

Figure 5:
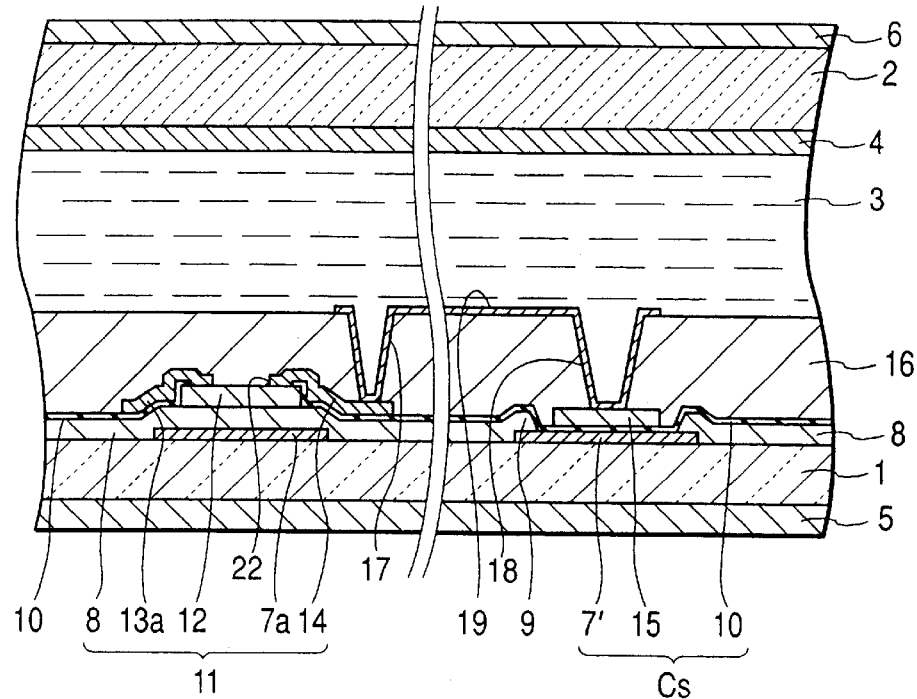
FIG. 5 is a fragmentary sectional view of an active-matrix liquid crystal display in a third embodiment according to the present invention.
Figure 6:
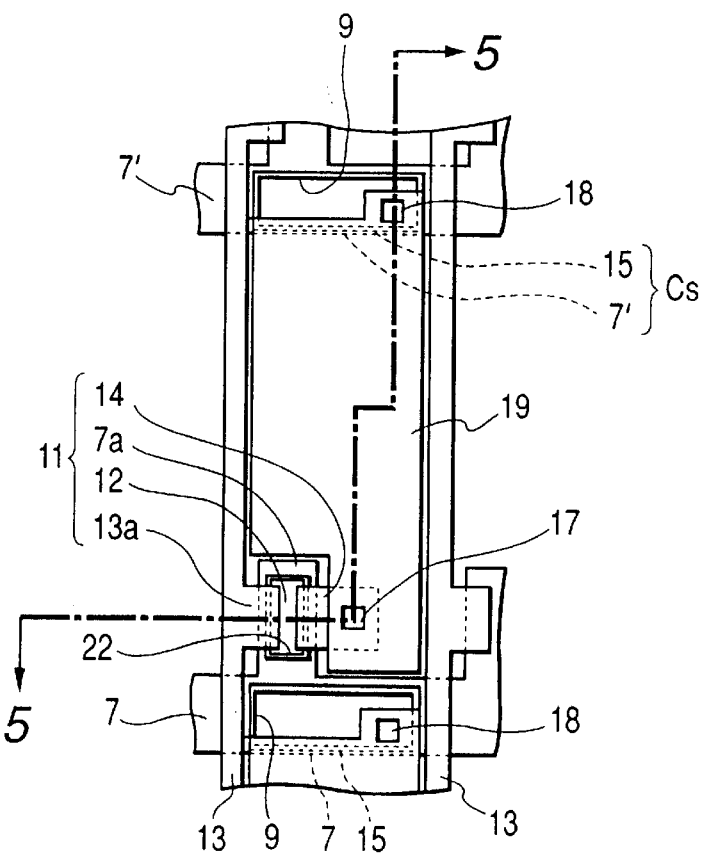
FIG. 6 is a plan view of an essential part of an array substrate included in the active-matrix liquid crystal display shown in FIG. 5.

An active-matrix liquid crystal display in a third embodiment according to the present invention will be described with reference to FIGS. 5 and 6, in which parts like or corresponding to those shown in FIGS. 3 and 4 are denoted by the same reference characters and the description thereof will be omitted. FIG. 6 is a plan view of an essential part of an array substrate included in the active-matrix liquid crystal display and FIG. 5 is a sectional view taken on line 5—5 in FIG. 6, showing the array substrate combined with a liquid crystal layer and upper components. The third embodiment is based on the same conception as that on which the second embodiment is based. In the third embodiment, the insulating film 10 for the storage capacitors Cs is not used for forming the gate insulating film for the TFTs 11. Part of a process for fabricating the active-matrix liquid crystal display in the third embodiment from the first step to a step of forming the semiconductor layer 12 is the same as that of the process for fabricating the active-matrix liquid crystal display in the second embodiment.

The insulating film 10 for the storage capacitors Cs is formed over the entire surface of the lower substrate 1, and parts of the insulating film 10 corresponding channels electrically connected to the source electrodes 13a and the drain electrodes 14 overlying the semiconductor layer 12 and parts for forming channels are removed by etching to form contact holes 22. A metal film for forming the source lines 13, the source electrodes 13a extending from the source lines 13, the drain electrodes 14 and the upper electrodes 15 of the storage capacitors Cs is formed over the entire surface of the lower substrate 1, and the metal film is patterned by etching. The upper electrodes 15 are formed only in flat regions of the insulating film 10 overlying the gate lines 7' serving as the lower electrodes. A process for forming the interlayer insulating film 16, the photolithographic process, a process for forming the transparent conductive film and a process for patterning the transparent conductive film to form the pixel electrodes 19 are the same as those employed in fabricating the first embodiment.

The third embodiment, similarly to the second embodiment, increases the degree of freedom of selecting a material for forming the insulating film 10 for the storage capacitors Cs, and the thickness of a film between the source electrode 13a and the gate electrode 7a and the thickness of a film between the drain electrode 14 and the gate electrode 7a are increased by the thickness of the insulating film 10. Consequently, the transistors TFTs 11 have a high dielectric strength. The aperture ratios of the second and the third embodiment, similarly to that of the first embodiment, are as large as about 55%.

As apparent from the foregoing description, the storage capacitor Cs includes the upper electrode connected to the pixel electrode, the lower electrode disposed opposite to the upper electrode and the insulating film sandwiched between the upper and the lower electrode, and the insulating film is different from the gate insulating film for the TFT. Therefore, the insulating film for the storage capacitors Cs can be formed in a small thickness independently of the thickness of the gate insulating film and/or the insulating film can be formed of a material having a large dielectric constant. Thus, the capacitance per unit area of the storage capacitors Cs can be increased. Consequently, the area of the storage capacitors Cs necessary for securing a predetermined capacitance may be small as compared with that of the pixel electrodes and the active-matrix liquid crystal display even for high-definition displaying has a large aperture ratio.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. An active-matrix liquid crystal display comprising:
   a transparent upper substrate;
   a transparent lower substrate disposed opposite to the upper substrate;
   a liquid crystal filled and sealed in a space between the upper and the lower substrate;
   a plurality of parallel gate lines formed on the lower substrate;
   a plurality of parallel source lines formed on the lower substrate so as to extend perpendicularly to the gate lines;
   thin-film transistors formed at intersections of the gate lines and the source lines, respectively;
   pixel electrodes connected to the thin-film transistors, respectively; and
   storage capacitors connected to the pixel electrodes, respectively;
   wherein separate films are used as an insulating film included in the storage capacitors and a gate insulating film included in the thin-film transistors, respectively, and each of the storage capacitors has an upper electrode connected to the pixel electrode and a lower electrode disposed opposite to the upper electrode with the insulating film sandwiched between the upper and the lower electrode.

2. The active-matrix liquid crystal display according to claim 1, wherein the upper electrodes are formed only in flat regions, respectively, on the insulating film overlying the lower electrodes.

3. The active-matrix liquid crystal display according to claim 1, wherein the insulating film for the storage capacitors and the gate insulating film for the TFTs are formed of the same material, and a thickness of the insulating film for the storage capacitors is smaller than that of the gate insulating film for the TFTs.

4. The active-matrix liquid crystal display according to claim 1, wherein the insulating film for the storage capacitors is formed of a material having a dielectric constant greater than that of a material forming the gate insulating film.

5. The active-matrix liquid crystal display according to claim 1, wherein the gate insulating film has an opening above and smaller than the lower electrode, the opening of the gate insulating film has edges, and the insulating film is continuously disposed above the gate insulating film and the opening of the gate insulating film from a portion of the gate insulating film proximate to and on one side of the lower electrode to a portion of the gate insulating film proximate to and on an opposing side of the lower electrode.

6. The active-matrix liquid crystal display according to claim 5, wherein the upper electrode has a smaller width than the lower electrode.

7. The active-matrix liquid crystal display according to claim 6, wherein the upper electrode is formed in the opening of the gate insulating film.

8. The active-matrix liquid crystal display according to claim 7, wherein the upper electrode and lower electrode are separated substantially entirely by the insulating film.

9. The active-matrix liquid crystal display according to claim 8, wherein the source electrodes are disposed above the insulating film and contact sides of semiconductor layers of the thin-film transistors.

10. The active-matrix liquid crystal display according to claim 8, wherein the source electrodes are disposed above the insulating film and contact semiconductor layers of the thin-film transistors only on a top of the semiconductor layers.

11. The active-matrix liquid crystal display according to claim 1, wherein the source electrodes are disposed above the insulating film and contact sides of semiconductor layers of the thin-film transistors.

12. The active-matrix liquid crystal display according to claim 1, wherein the source electrodes are disposed above the insulating film and contact semiconductor layers of the thin-film transistors only on a top of the semiconductor layers.

13. The active-matrix liquid crystal display according to claim 1, wherein a thickness of the gate insulating film is at least three times a thickness of the insulating film.

14. The active-matrix liquid crystal display according to claim 1 wherein an aperture ratio of the active-matrix liquid crystal display is at least about 55%.

15. An active-matrix liquid crystal display comprising:

a transparent upper substrate;

a transparent lower substrate disposed opposite to the upper substrate;

a liquid crystal filled and sealed in a space between the upper and the lower substrate;

a plurality of parallel gate lines formed on the lower substrate;

a plurality of parallel source lines formed on the lower substrate so as to extend perpendicularly to the gate lines;

thin-film transistors formed at intersections of the gate lines and the source lines, respectively, and having a gate insulating film;

pixel electrodes connected to the thin-film transistors, respectively;

lower electrodes disposed below the pixel electrode;

auxiliary electrodes disposed between the lower electrodes and the pixel electrodes; and a separate insulating film disposed between the auxiliary electrodes and the pixel electrodes; the insulating film, pixel electrodes, auxiliary electrodes, and lower electrodes forming a storage capacitor.

16. The active-matrix liquid crystal display according to claim 15, wherein the insulating film for the storage capacitors and the gate insulating film for the TFTs are formed of the same material, and the thickness of the insulating film for the storage capacitors is smaller than that of the gate insulating film for the TFTs.

17. The active-matrix liquid crystal display according to claim 15, wherein the insulating film for the storage capacitors is formed of a material having a dielectric constant greater than that of a material forming the gate insulating film.

18. The active-matrix liquid crystal display according to claim 17, wherein the auxiliary electrode is formed in the opening of the gate insulating film.

19. The active-matrix liquid crystal display according to claim 15, wherein the gate insulating film has an opening above and smaller than the lower electrode, the opening of the gate insulating film has edges, and the insulating film is continuously disposed above the gate insulating film and the opening of the gate insulating film from a portion of the gate insulating film proximate to and on one side of the lower electrode to a portion of the gate insulating film proximate to and on an opposing side of the lower electrode.

20. The active-matrix liquid crystal display according to claim 15, wherein the lower electrode and auxiliary electrode have the same width.

21. The active-matrix liquid crystal display according to claim 15, wherein the insulating film is disposed above the source electrodes.

22. The active-matrix liquid crystal display according to claim 15, wherein a thickness of the gate insulating film is at least three times a thickness of the insulating film.

* * * * *

UNITED STATES PATENT AND TRADEMARK OFFICE
CERTIFICATE OF CORRECTION

PATENT NO.    : 6,356,318 B1                                              Page 1 of 1
DATED         : March 12, 2002
INVENTOR(S)   : Ken Kawahata It is certified that error appears in the above-identified patent and that said Letters Patent is hereby corrected as shown below:

Column 9,
Line 41, insert -- , -- (comma) immediately after "claim 1".

Signed and Sealed this

Twenty-fifth Day of February, 2003

JAMES E. ROGAN
*Director of the United States Patent and Trademark Office*